(12) United States Patent
Shimada

(10) Patent No.: US 6,261,114 B1
(45) Date of Patent: Jul. 17, 2001

(54) SOCKET FOR ELECTRICAL PARTS

(75) Inventor: Hideo Shimada, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/580,565

(22) Filed: May 30, 2000

(30) Foreign Application Priority Data

May 31, 1999 (JP) .................................................. 11-151839

(51) Int. Cl.[7] .................................................. H01R 11/22
(52) U.S. Cl. ............................................ 439/266; 439/268
(58) Field of Search .................................... 439/266, 268, 439/264, 263, 261, 259, 330

(56) References Cited

U.S. PATENT DOCUMENTS

| | | | |
|---|---|---|---|
| 5,320,550 | * | 6/1994 | Uratsuji et al. ...................... 439/266 |
| 5,690,281 | * | 11/1997 | Ikeya et al. ........................... 439/268 |
| 5,800,194 | * | 9/1998 | Yamagishi ............................. 439/266 |
| 6,027,355 | * | 2/2000 | Ikeya .................................... 439/268 |
| 6,042,409 | * | 3/2000 | Ohshima .............................. 439/268 |
| 6,050,836 | * | 4/2000 | Tohyama .............................. 439/266 |

\* cited by examiner

*Primary Examiner*—Tho D. Ta
(74) *Attorney, Agent, or Firm*—Staas & Halsey LLP

(57) ABSTRACT

In a socket for an IC package as an electrical part, a socket body is provided for the socket. The socket body has a mount portion on which an electrical part is mounted. The electrical part has a solder ball. The contact pin is arranged to the socket body and adapted to be contacted to or separated from the solder ball of the electrical part. A movable plate is disposed to the socket body to be movable with respect to the socket body. The contact pin has an elastic piece formed at a front end portion thereof with a contact portion, and the contact portion is elastically deformed in accordance with the movement of the movable plate so as to displace the contact portion by a displacement length to separate the contact portion from a side surface of the solder ball. A stopper portion is provided for the socket body and adapted to be contacted to the moving electrical part so at to stop the electrical part at a time when the solder ball of the electrical part is stuck to the contact portion so that the electrical part moves in accordance with the displacement of the contact portion. The displacement length of the contact pin is longer than a length of movement of the electrical part to the stopper portion.

5 Claims, 15 Drawing Sheets

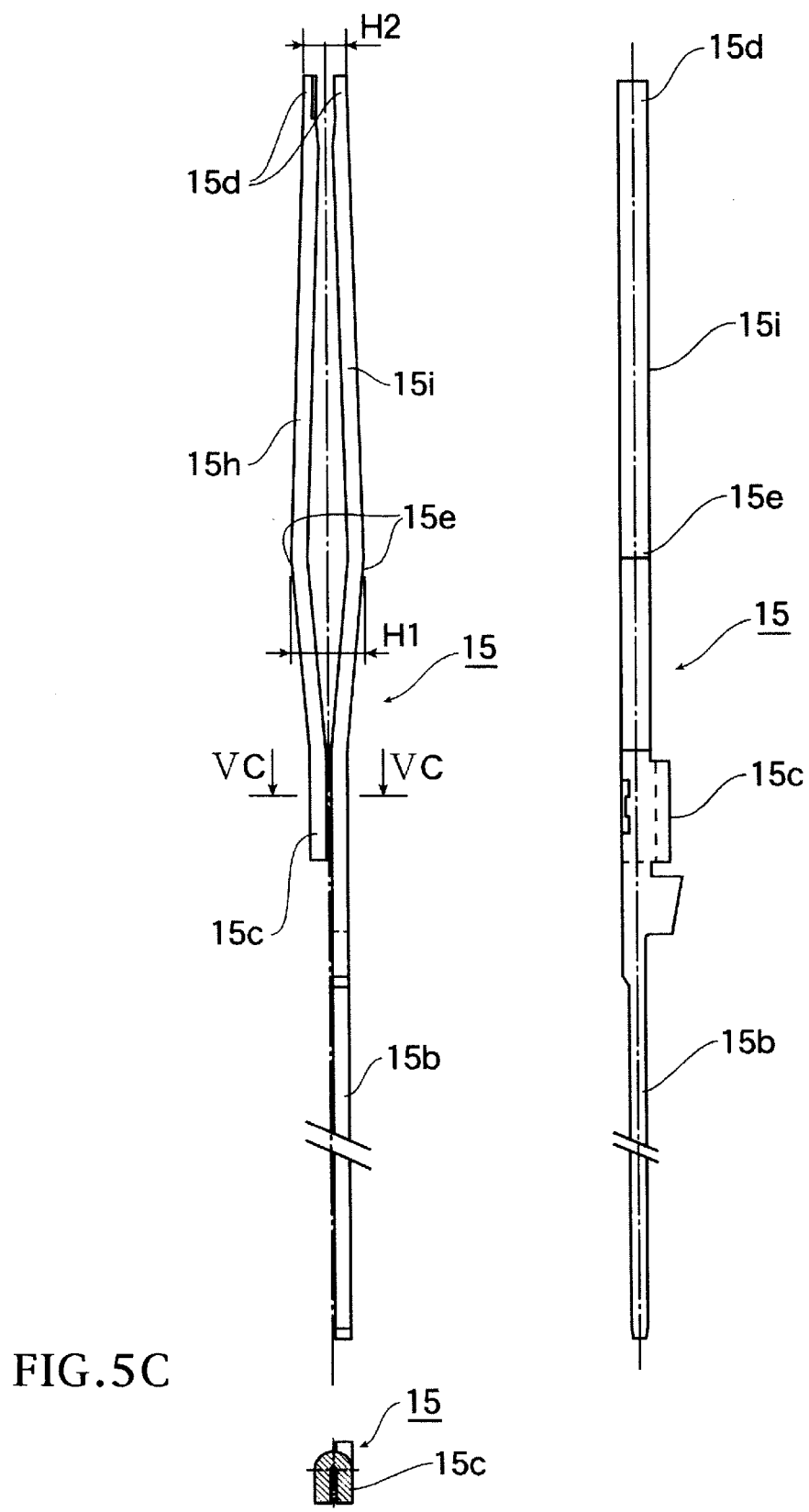

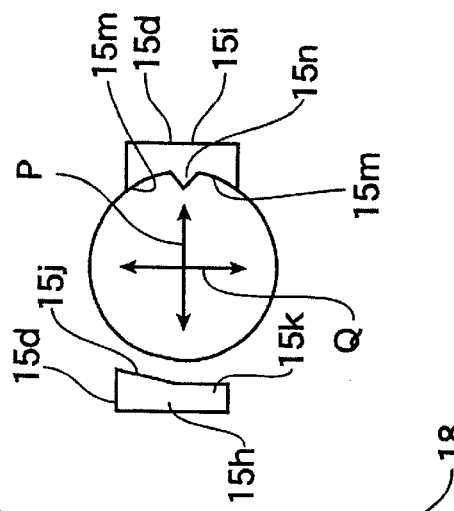
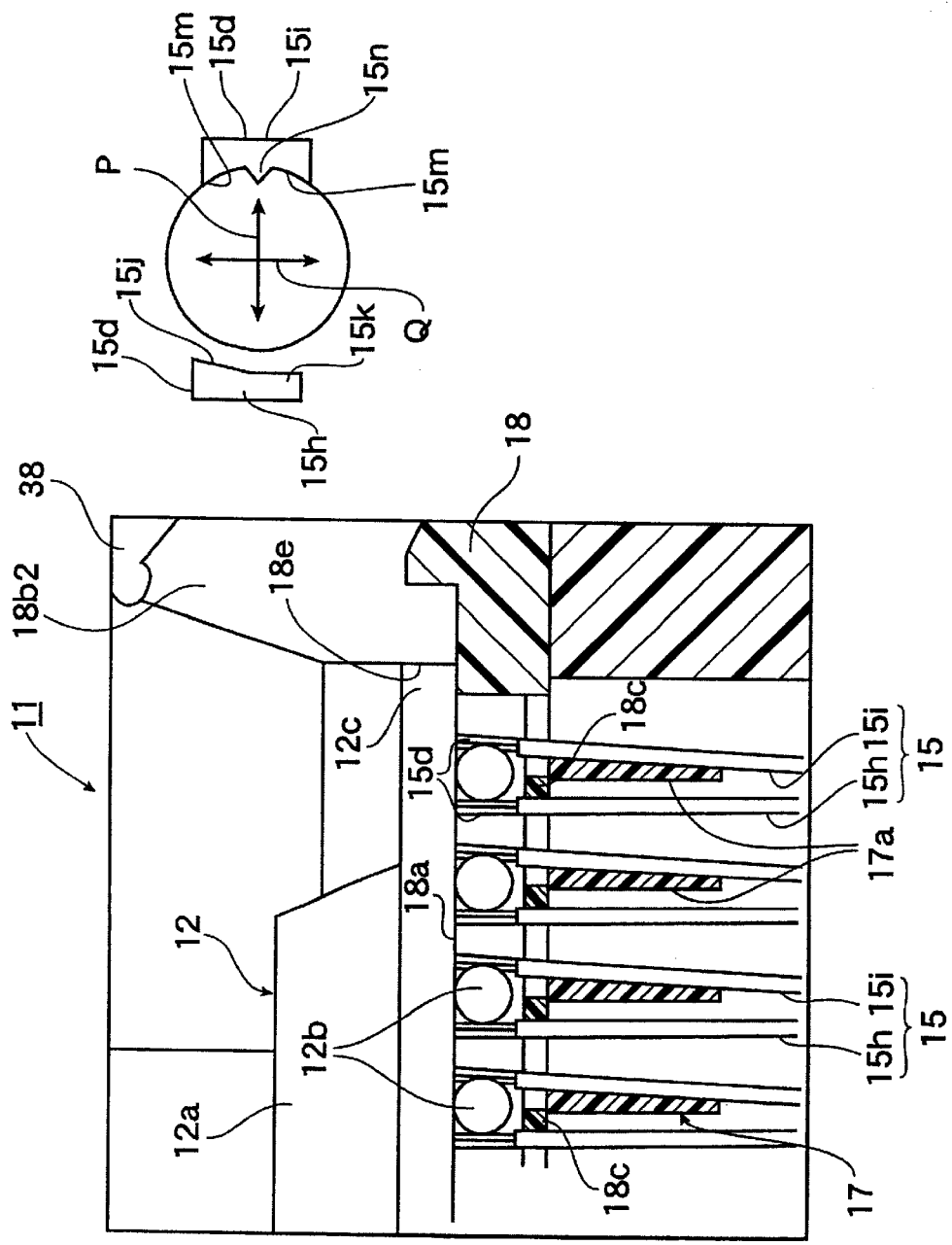
FIG.13A
FIG.13B

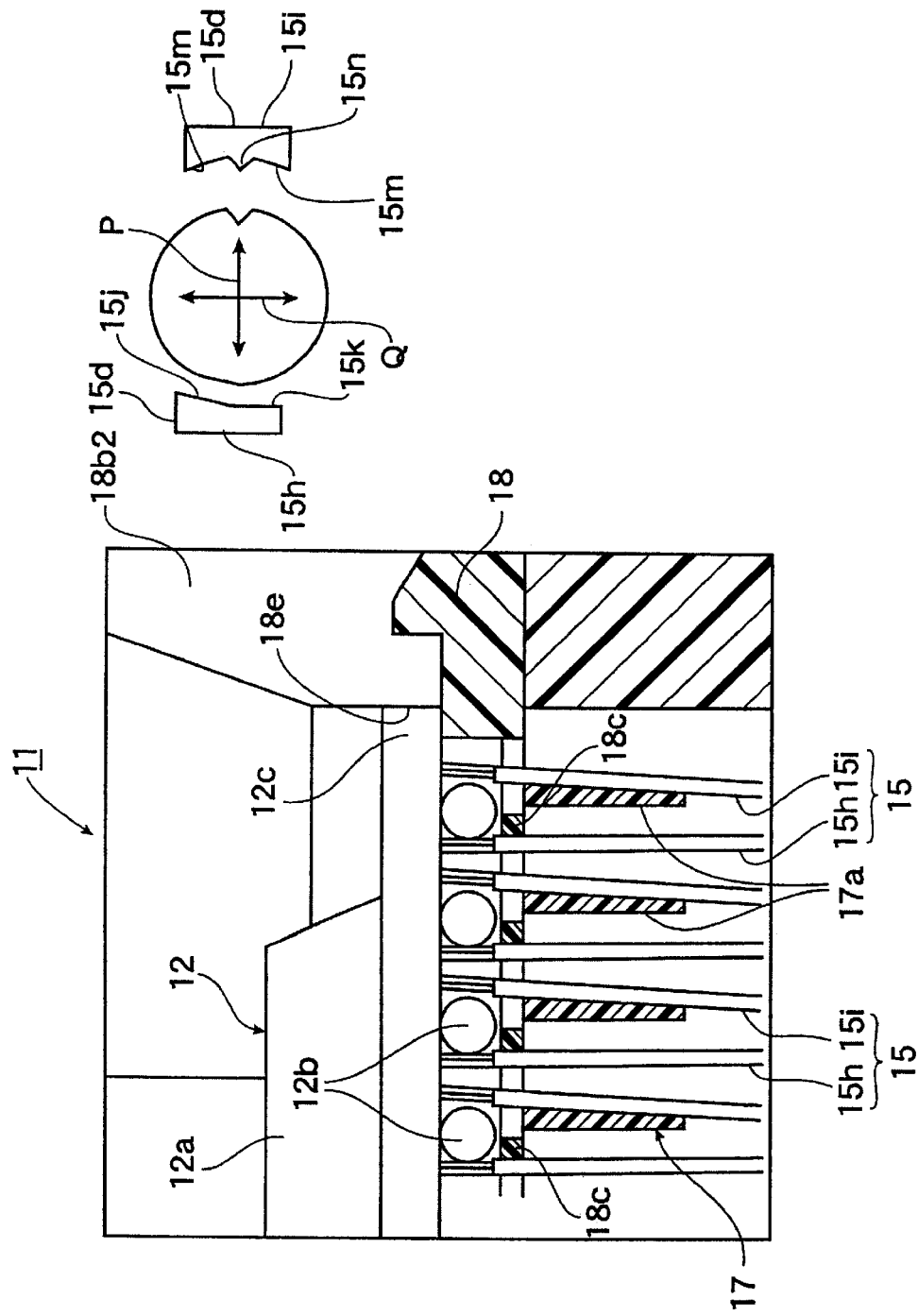

FIG.15A
FIG.15B
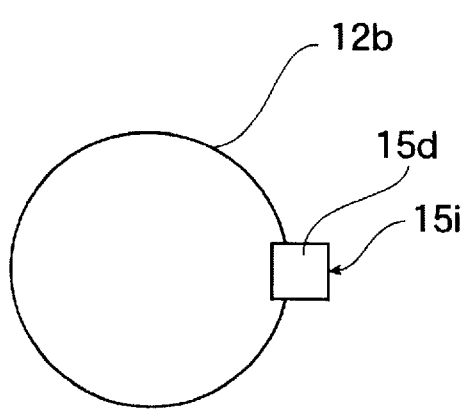
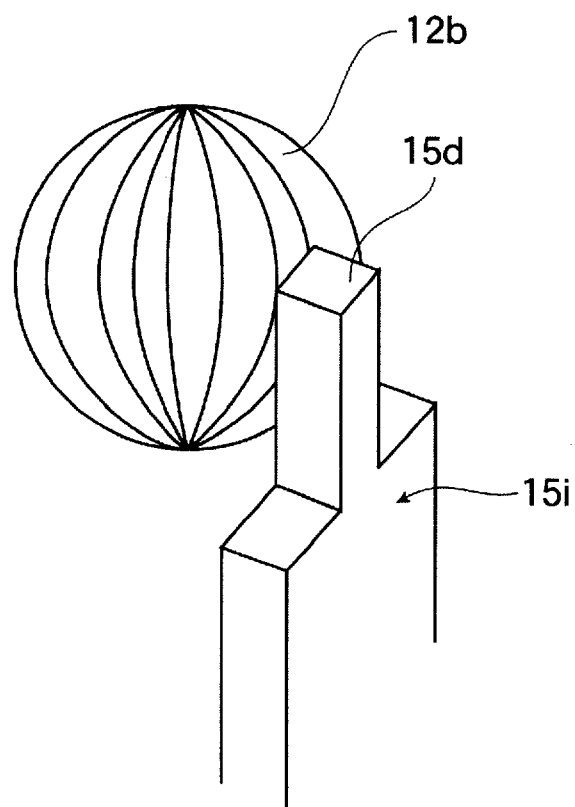

SOCKET FOR ELECTRICAL PARTS

BACKGROUND OF THE INVENTION

1. Field of the Invention

The present invention relates to a socket for an electrical part for detachably holding an electrical part such as a semiconductor device (called as "IC package" hereinafter).

Particularly, the present invention relates to a socket for an electrical part, which is adapted to prevent a contact portion of a contact pin from being stuck to a solder ball that is a terminal of the electrical part.

2. Description of the Related Art

As a conventional "socket for electrical parts" of this kind, there is provided an IC socket for detachably holding an IC package as "electrical part".

The IC package includes a BGA (Ball Grid Array) type of IC package which has a rectangular-shaped package body and a large number of solder balls mounted on a bottom surface of the package body.

Moreover, a contact pin is disposed to the IC socket and, to the contact pin, a pair of elastic pieces is formed. A contact portion is formed to one end portion of each of the elastic pieces so as to be contacted to a side portion of the solder ball and separated therefrom. One of the paired elastic pieces is pressed by a movable plate sliding in a horizontal direction to be elastically deformed thereby When the movable plate is slid from an original position so as to elastically deform one of the paired elastic pieces, an interval (distance or gap) between both of the contact portions of both of the elastic pieces is widened so that the solder ball is inserted into the interval of both of the contact portions.

After the inserting work, the movable plate is returned to the original position so that the contact portion of one of the paired elastic pieces is returned to an original position at which no pressing force by the movable plate is applied, whereby the solder ball is clamped by both of the contact portions to electrically connected thereto.

In a state that the solder ball of the IC package and the contact portions of the paired elastic pieces of the IC socket are electrically connected, for example, a burn-in test is carried and, thereafter, similarly to the operation mentioned above, the movable plate is slid so as to elastically deform one of the paired elastic pieces, thereby widening the interval between both of the contact portions of both of the elastic pieces.

As a result of widening the interval between both of the contact portions of the paired elastic pieces, both of the contact portions thereof are separated from the solder ball and, thereafter, the IC package is removed from the IC socket with an automatic machine.

In this structure of the IC socket, by only sliding the movable plate, it is possible to mount the IC package on the IC socket and remove it therefrom without using inserting and extracting force, thereby improving mounting and removing working efficiency of the IC package.

However, in the conventional IC socket, while carrying out the burn-in test, the IC package is heated at approximately 125° C. so that the solder ball gets to be softened to frequently be stuck to at least one of the contact portions.

In a state that the solder ball is stuck to at least one of the contact portions, when deforming one of the paired elastic pieces to widen the interval between both of the contact portions, in some cases, the solder ball is not separated from at least one of the contact portions with being stuck thereto.

In some cases where the solder ball is not separated from at least one of the contact portions, there is the possibility that it is impossible to remove, with the automatic machine, the IC package from the IC socket without using extracting force.

SUMMARY OF THE INVENTION

It is therefore an object of the present invention to provide a socket for an electrical part capable of preventing the contact portions of contact pins of the socket from being stuck to a solder ball of the electrical part and making it possible to remove the electrical part from the socket with no use of extracting force.

In order to achieve the above object, according to a first aspect of the present invention, there is provided a socket for an electrical part comprising:

a socket body having a mount portion on which an electrical part is mounted, the electrical part having a solder ball;

a contact pin arranged to the socket body and adapted to be contacted to or separated from the solder ball of the electrical part;

a movable plate disposed to the socket body to be movable with respect to the socket body; and stopper means provided for the socket body and adapted to be contacted to the moving electrical part to stop the electrical part at a time when the solder ball of the electrical part moves in accordance with the displacement of the contact portion, the contact pin having an elastic piece formed at a front end portion thereof with a contact portion, the contact portion being elastically deformed in accordance with the movement of the movable plate so as to displace the contact portion by a displacement length to separate the contact portion from a side surface of the solder ball, and the displacement length of the contact pin being longer than a length of movement of the electrical part to the stopper means.

According to the one aspect of the present invention, because, when the solder ball of the electrical part is stuck to the contact portion so that the electrical part moves in accordance with the displacement of the contact portion, the stopper means is contacted to the moving electrical part to stop the electrical part, and the displacement length of the contact pin is longer than the length of movement of the electrical part to the stopper means, it is possible to surely remove the contact portion from the solder ball. Therefore, it is permitted to prevent the contact portion from being stuck to the solder ball, making it possible to remove the electrical part from the socket therefor without using extracting force.

In a preferred embodiment of this one aspect, the contact pin has a pair of elastic pieces formed at front end portions thereof with a pair of contact portions, one of the contact portions of one of the elastic pieces being formed so that it is easy for the solder ball to be stuck to one of the contact portions, as compared with another one of the contact portions of another one of the elastic pieces, and the stopper means is formed on one side portion of the socket body, so that when the solder ball of the electrical part is stuck to one of the contact portions of one of the elastic pieces, the electrical part moving in accordance with the displacement of one of the contact portions is contacted to the stopper means.

According to the one aspect of the invention, it is easy for the solder ball to be stuck to one of the contact portions, as compared with another one of the contact portions of another one of the elastic pieces. Moreover, the stopper means is formed on the one side portion of the socket body, so that, when the solder ball of the electrical part is stuck to one of the contact portions of one of the elastic pieces, the electrical part moving in accordance with the displacement of one of the contact portions is contacted to the stopper means.

Therefore, it is possible to stick the solder ball only one of the contact portions of one of the elastic pieces so that it is permitted to surely prevent the contact portion from being stuck to the solder ball, only by providing the stopper means to the one side portion of the socket body.

In preferred embodiment of this one aspect, the movable plate is adapted to be movable in a direction substantially parallel to the mount surface, one of the elastic pieces is a movable side elastic piece elastically movable by the movable plate, another one of the elastic pieces is a stationary side elastic piece, and the stopper means is formed on the one side portion of the socket body so that, when the solder ball of the electrical part is stuck to the contact portion of the movable side elastic piece, the electrical part moving in accordance with the displacement of the contact portion of the movable side elastic piece is contacted to the stopper means.

According to the one aspect of the invention, it is possible to obtain the above effects by using the socket having the structure in that the movable plate is moved in parallel to the mount surface.

In preferred embodiment of this one aspect, the contact portion of the elastic piece of the contact pin is formed with a projection portion adapted to bite into a side surface of the solder ball so that it is easy for the solder ball to be stuck to the contact portion.

According to the one aspect of the invention, by forming on the contact portion only the projection portion adapted to bite into the side surface of the solder ball, it is easy to stick the solder ball of the electrical part to the contact portion, making it possible to improve the reliability of removing the contact portion from the solder ball.

In preferred embodiment of this one aspect, the contact portion has a substantially rod shape and adapted to bite into a side surface of the solder ball so that it is easy for the solder ball to be stuck to the contact portion.

According to the one aspect of the invention, because the contact portion has a substantially rod shape, it is possible to render the contact portion bite into the side surface of the solder ball.

For achieving such object, according to another aspect of the present invention, there is provided a socket for an electrical part comprising:

a socket body having a mount portion on which an electrical part is mounted, the electrical part having a solder ball;

a contact pin arranged to the socket body and adapted to be contacted to or separated from the solder ball of the electrical part;

a movable plate disposed to the socket body to be movable with respect to the socket body, stopper means provided for the socket body and adapted to be contacted to the moving electrical part to stop the electrical part at a time when the electrical part moves in accordance with the displacement of the contact portion while the solder ball is contacted to the contact portion, the contact pin having an elastic piece formed at a front end portion thereof with a contact portion, the contact portion being elastically deformed in accordance with the movement of the movable plate so as to displace the contact portion by a displacement length to separate the contact portion from a side surface of the solder ball.

In preferred embodiment of this another aspect, the contact pin has a pair of elastic pieces formed at front end portions thereof with a pair of contact portions, one of the contact portions of one of the elastic pieces being provided with a press portion for pressing the solder ball, and the stopper means is formed on one side portion of the socket body so that, when the electrical part moves in accordance with the displacement of one of the contact portions, while the solder ball is pressed to be fit to the press portion of one of the contact portions, the electrical part moving in accordance with the displacement of one of the contact portions is contacted to the stopper means.

BRIEF DESCRIPTION OF THE DRAWINGS

Other objects and aspects of the present invention will become apparent from the following description of embodiments with reference to the accompanying drawings in which:

FIG. 5A is a front view showing a contact pin according to the first embodiment;

FIG. 5B is a right-side view showing the contact pin of FIG. 5A;

FIG. 5C is a sectional view taken on line VC—VC in FIG. 5A;

FIG. 13A is a longitudinal sectional view corresponding to FIG. 12A and showing a state that a slide plate is further moved from the state in FIG. 12A in the right direction according to the first embodiment;

FIG. 13B is a longitudinal sectional view corresponding to FIG. 12B and showing a state that a slide plate is further moved from the state in FIG. 12B in the right direction according to the first embodiment;

FIG. 14A is a longitudinal sectional view corresponding to FIG. 13A and showing a state that a slide plate is further moved from the state in FIG. 13A in the right direction according to the first embodiment;

FIG. 14B is a longitudinal sectional view corresponding to FIG. 13B and showing a state that a slide plate is further moved from the state in FIG. 13B in the right direction according to the first embodiment;

FIG. 15A is a plan view showing a state that a contact portion bites into a solder ball according to a second embodiment of the present invention; and FIG. 15B is a perspective view showing the solder ball and the contact portion according to the second embodiment of the present invention.

DESCRIPTION OF THE PREFERRED EMBODIMENTS

Figure 1:
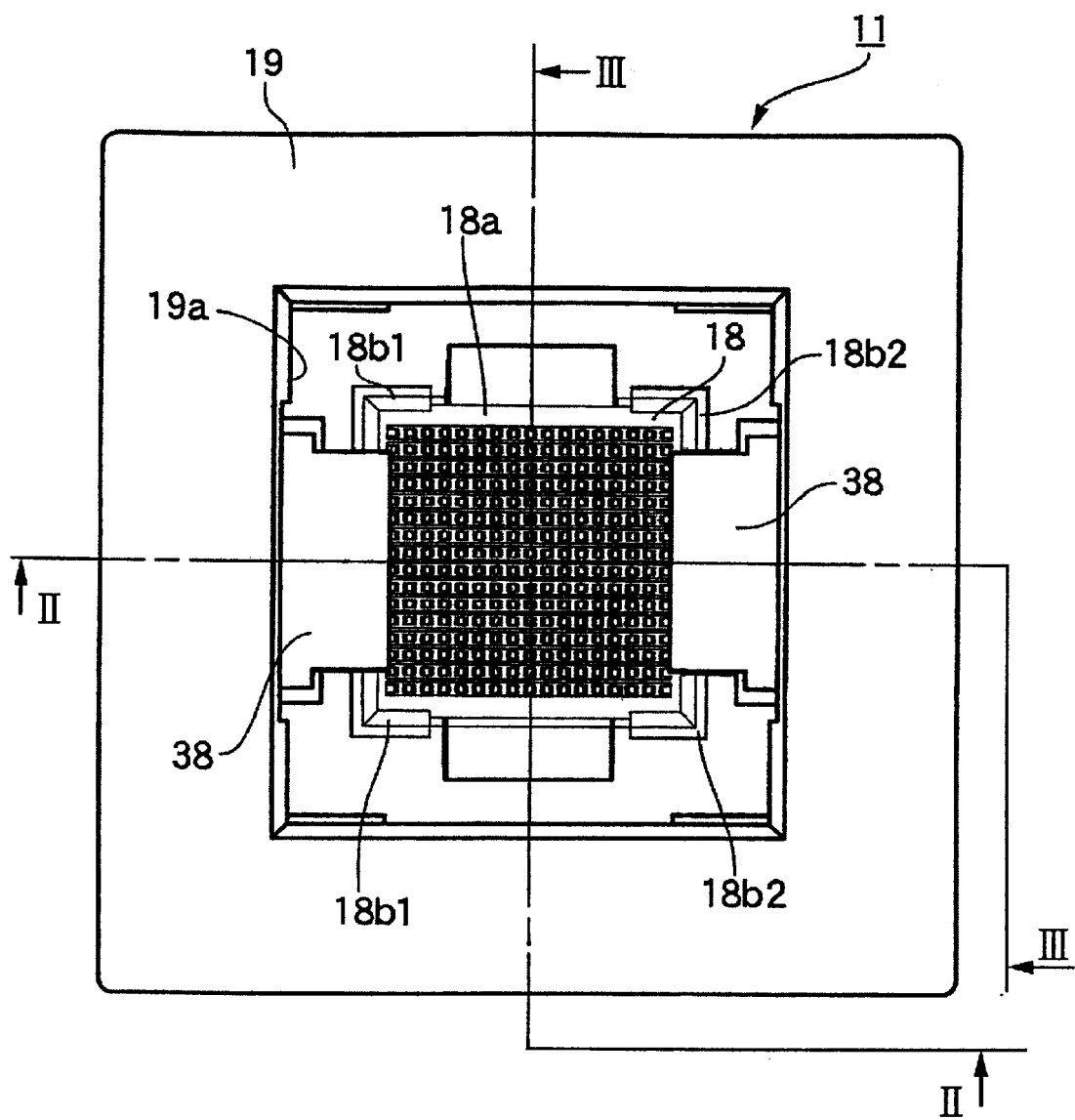
FIG. 1 is a top plan view of an IC socket according to a first embodiment of the present invention.

The preferred embodiments of the present invention will be described hereinafter with reference to the accompanying drawings.

[First Embodiment]

FIG. 1 to FIG. 14B represent the first embodiment of the present invention, in which reference numeral 11 denotes an IC socket as "socket for electrical parts". For carrying out a performance test of an IC package as "electrical part", the IC socket 11 electrically connects solder balls 12b as "terminals" of the IC package 12 to a printed circuit board (not shown) of a measuring device such as tester.

Figure 4A:
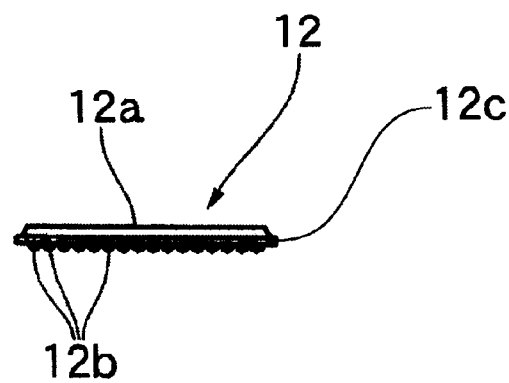
FIG. 4A is a front view showing an IC package according to the first embodiment.
Figure 4B:
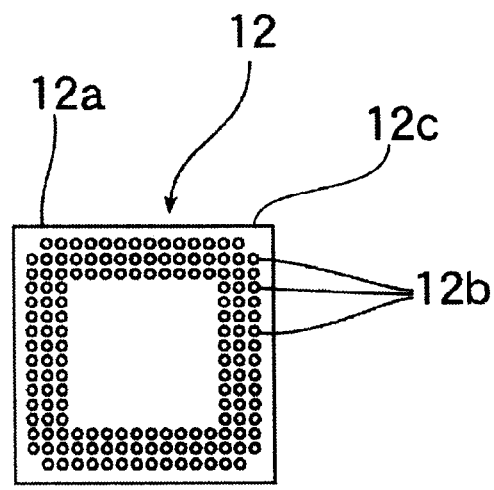
FIG. 4B is a bottom plan view showing the IC package according to the first embodiment.

This IC package 12, as shown in FIGS. 4A and 4B for example, is called as Ball Grid Array (BGA) type. The BGA type of IC package 12 is provided with a package body 12a having, for example, a substantially square shape. The IC package 12 is also provided with a plurality of solder balls 12b each having a substantially spherical shape and mounted on a bottom (lower) surface of the package body 12a so as to project downward therefrom. The solder balls 12b are arranged to provide a matrix-shape (grid array).

Figure 2:
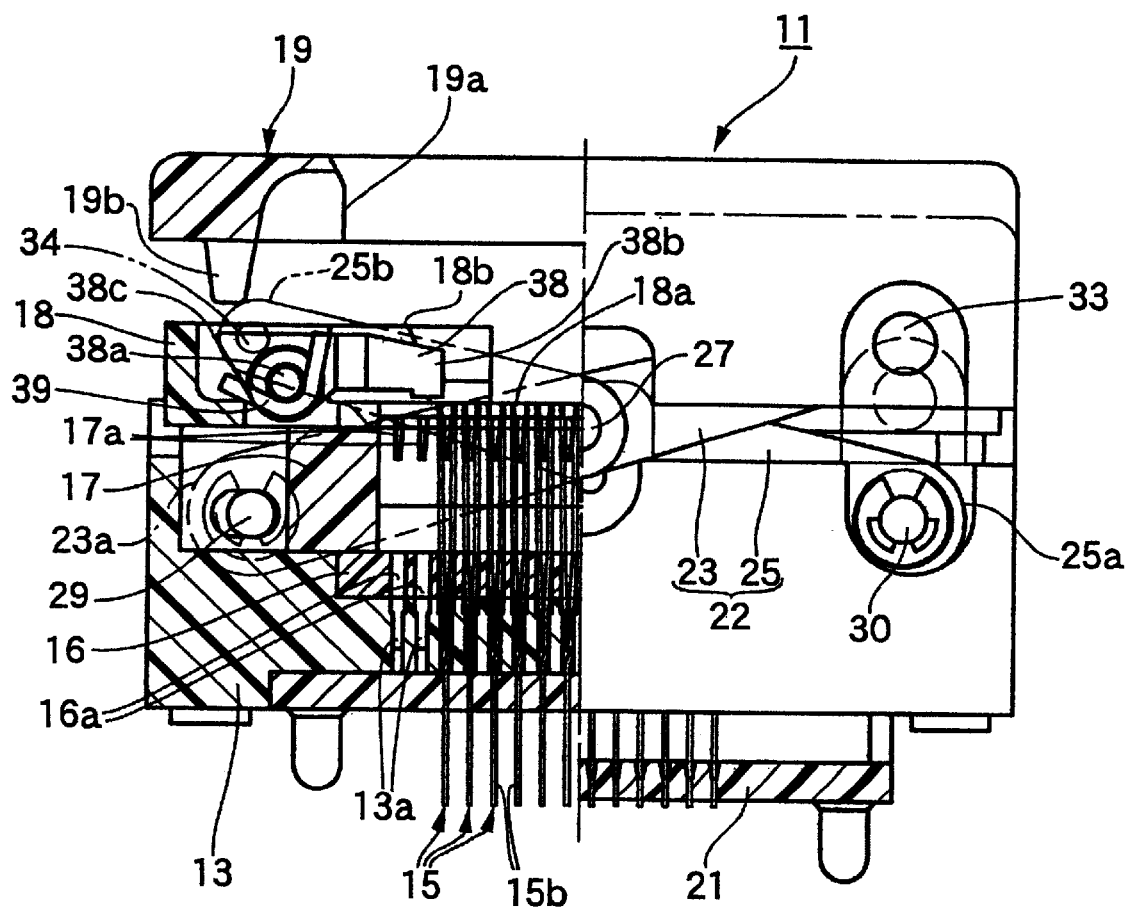
FIG. 2 is a sectional view taken along a line II—II in FIG. 1 according to the first embodiment.

On the other hand, the IC socket 11, as shown in FIG. 2, is provided with a socket body 13 mounted on the printed circuit board and a plurality of contact pins 15. The contact pins 15 are arranged in a matrix-shape (grid array) similar to the solder balls and permitted to be contacted to or separated from the solder balls 12b, respectively.

The IC socket 11 is also provided with a preload plate 16 through which the contact pins 15 are inserted, a slide plate 17 as "movable plate" and a top plate 18. The preload plate 16, the slide plate 17 and the top plate 18 are mounted on an upper side of the socket body 13 so as to be successively laminated in an upward direction of the socket body 13. Moreover, on the upper side of the top plate 18, an operation member 19 is arranged for making the slide plate 17 slide in a horizontal direction.

The contact pin 15 has an elasticity or springy property and is formed in such a manner that a plate member having a superior conductivity is pressed through a press working so as to provide a shape as shown in FIGS. 5A–5C, FIG. 6 and FIGS. 7A–7C.

More in detail, the contact pin 15 is formed, at its upper end side, with a stationary side elastic piece 15h and a movable side elastic piece 15i (a pair of elastic pieces) and, at its lower end side, with one integrated solder tail portion 15b. Further, herein later, the stationary side elastic piece will be referred simply to the stationary elastic piece and the movable side elastic piece will be also referred simply to the movable elastic piece.

The contact pin 15 is also provided, at its lower side of the elastic pieces 15h and 15i, with a base portion 15c so that the elastic pieces 15h and 15i are integrated thereby. The elastic pieces 15h and 15i extend upward from the base portion 15c and the solder tail portion 15b extends downward therefrom. The base portion 15c is bent so as to have a substantially U-shape in its lateral cross section so that the elastic pieces 15h and 15i branch from the base portion 15c and that the elastic pieces 15h and 15i are opposite to each other. Each of the elastic pieces 15h and 15i is formed at its uppermost end (front end) with a contact portion 15d so that each contact portion 15d is contacted to a side surface portion of the solder ball 12b or separated therefrom, whereby the solder ball 12b is adapted to be clamped in the contact portions 15d of the elastic pieces 15h and 15i.

Figure 6:
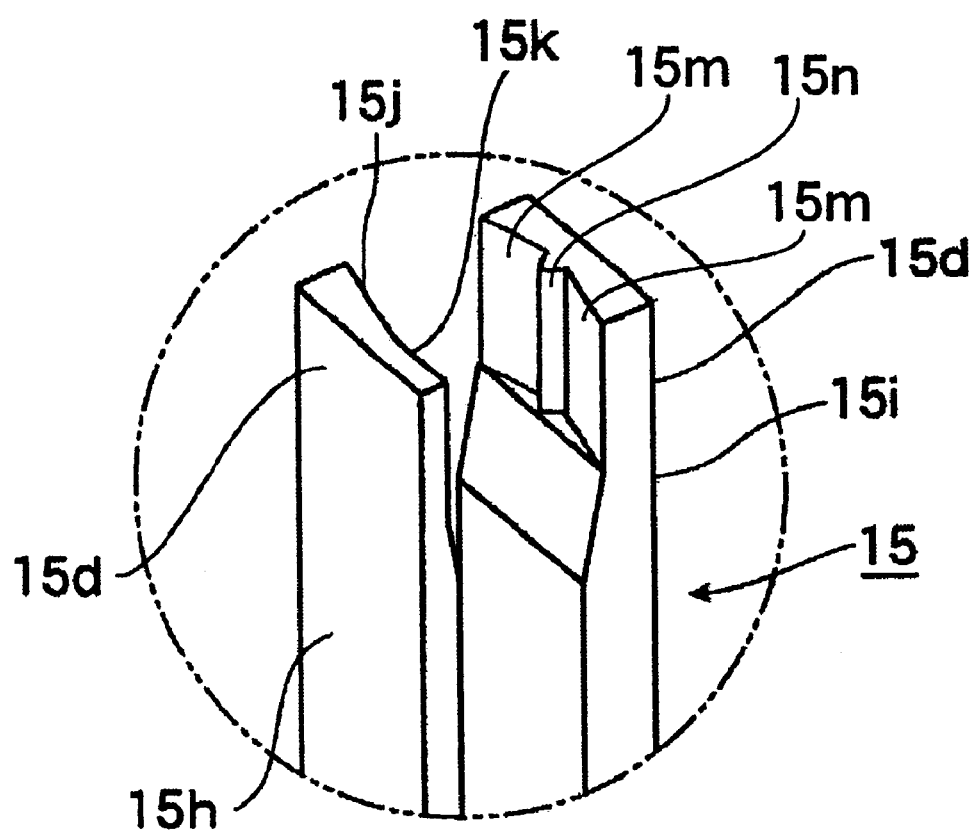
FIG. 6 is a perspective view showing a contact portion of the contact pin according to the first embodiment.

As shown in FIG. 6, the contact portion 15d of the movable elastic piece 15i as "one of elastic pieces" is formed with a pair of inclined surfaces 15m and a projection portion 15n. In view of a top plan side of the IC socket 11 which is being used, the paired inclined surfaces 15m are arranged in substantially tangential directions at contact positions of the solder ball 12b to the contact portion 15d. The projection portion 15n has a substantially triangular shape and is formed between the paired inclined surfaces 15m.

On the other hand, the contact portion 15d of the stationary elastic piece 15h as "another one of elastic piece" is formed with an inclined surface 15j and an orthogonal surface 15k. In view of a top plan side of the IC socket 11 which is being used, as shown in FIGS. 11A and 11B, the inclined surface 15j is arranged to be inclined at a predetermined angle with respect to a direction Q orthogonal to a displacement direction P of the movable elastic piece 15i, and the orthogonal surface 15k is arranged to extend to the inclined surface 15j and to be orthogonal to the displacement direction P.

Figures 11A, 11B:
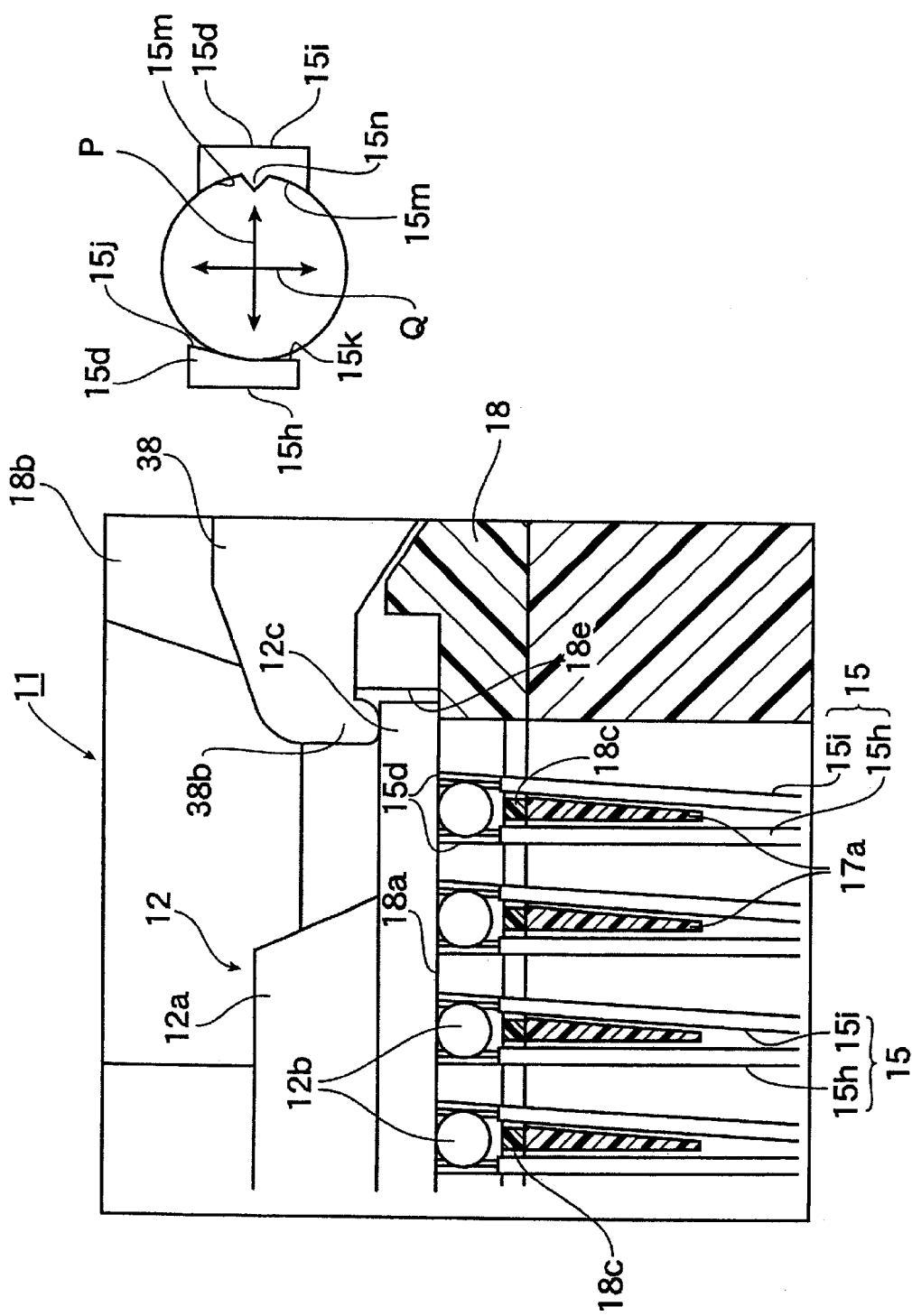
FIG. 11A is a longitudinal sectional view showing a state that the solder ball of the first embodiment is clamped by the paired contact portions.
FIG. 11B is a plan view showing a state that the solder ball of the first embodiment is clamped by the paired contact portions.
Figures 12A, 12B:
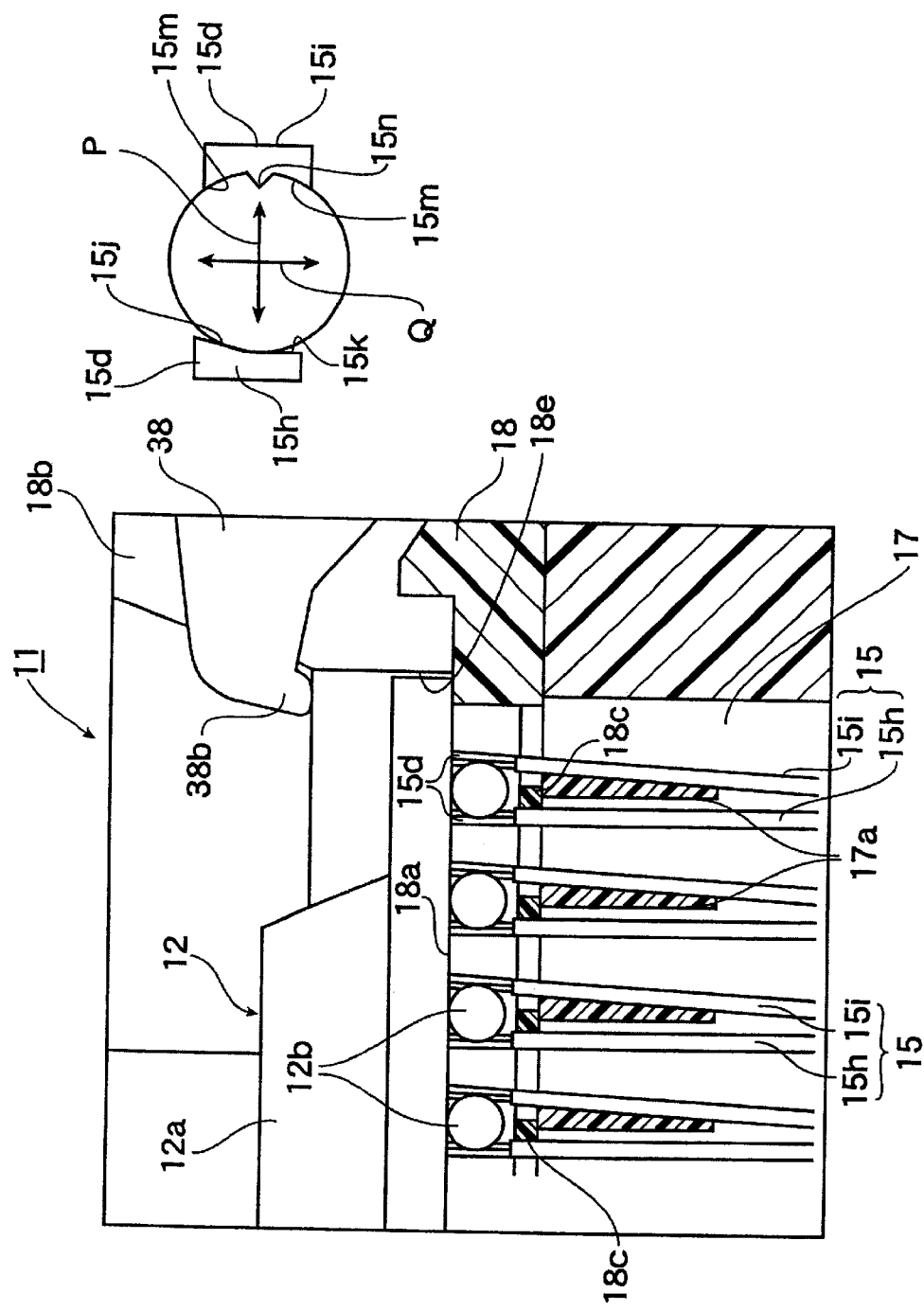
FIG. 12A is a longitudinal sectional view corresponding to FIG. 11A and showing a state that a slide plate is moved from the state in FIG. 11A in the right direction according to the first embodiment.
FIG. 12B is a longitudinal sectional view corresponding to FIG. 11B and showing a state that a slide plate is moved from the state in FIG. 11B in the right direction according to the first embodiment.

According to this structure, as shown in FIGS. 11A and 11B, because the projection portion 15n of the contact portion 15d of the movable elastic piece 15i is adapted to press the solder ball 12b so that the solder ball 12b is fit to the projection portion 15n, the solder ball 12b bites into the projection portion 15n of the movable elastic piece 15i. Therefore, the contact portion 15d of the movable elastic piece 15i is formed so that it is easy for the solder ball 12b to be stuck to the contact portion 15d of the movable elastic piece 15i, as compared with the contact portion 15d of the stationary elastic piece 15h.

The elastic pieces 15h and 15i of the contact pin 15 are provided with bent portions 15e, respectively. The bent portions 15e of the respective elastic pieces 15h and 15i are formed at respective middle portions thereof so that the respective middle portions of the elastic pieces 15h and 15i are bent far from each other. Vertex portions of the respective bent portions 15e are pressed by the preload plate 16. While the bent portions 15e are not subjected to any external force, as shown in FIG. 5A, a width (interval) H1 formed between the respective vertex portions of the bent portions 15e of the paired elastic pieces 15h and 15i is made wider than a width (interval) H2 formed between respective top ends of the paired contact portions 15d thereof.

On the other hand, press-fit holes 13a are formed through the socket body 13a and through holes are formed through the printed circuit board (not shown).

The solder tail portion 15b and the base portion 15c of the contact pin 15 are integrally pressed to fit in the press-fit hole 13a so that the solder tail portion 15b projects downward therefrom. The projecting solder tail portion 15b further projects downward through a locate board 21 so as to be inserted into the through hole. Each of the solder tail portions 15b of each of the contact pins 15 is inserted in each of the through holes of the printed circuit board, so that each of the solder tail portions 15b is soldered to be electrically connected to the printed circuit board.

Figure 7A:
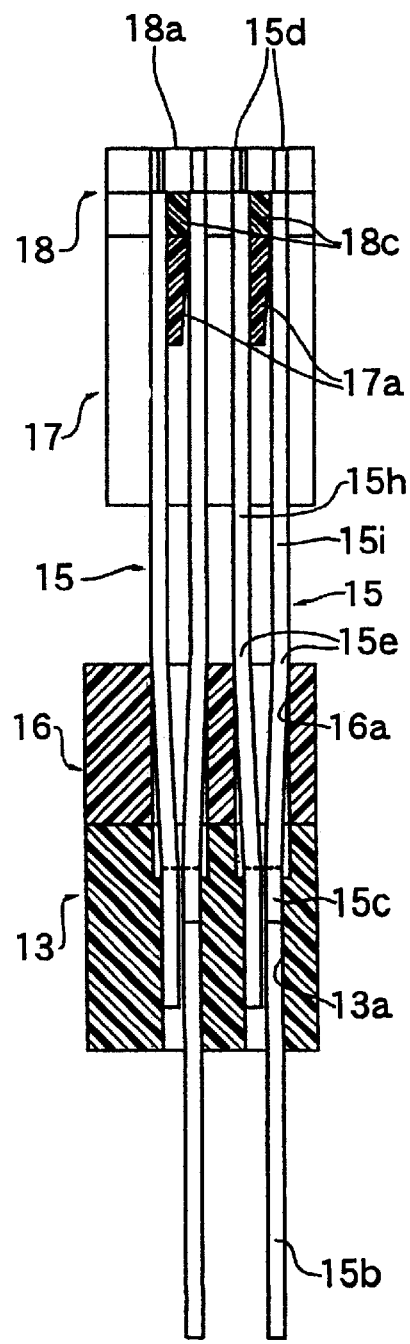
FIG. 7A is a sectional view showing the contact pin with a pair of contact portions being closed according to the first embodiment.
Figure 7B:
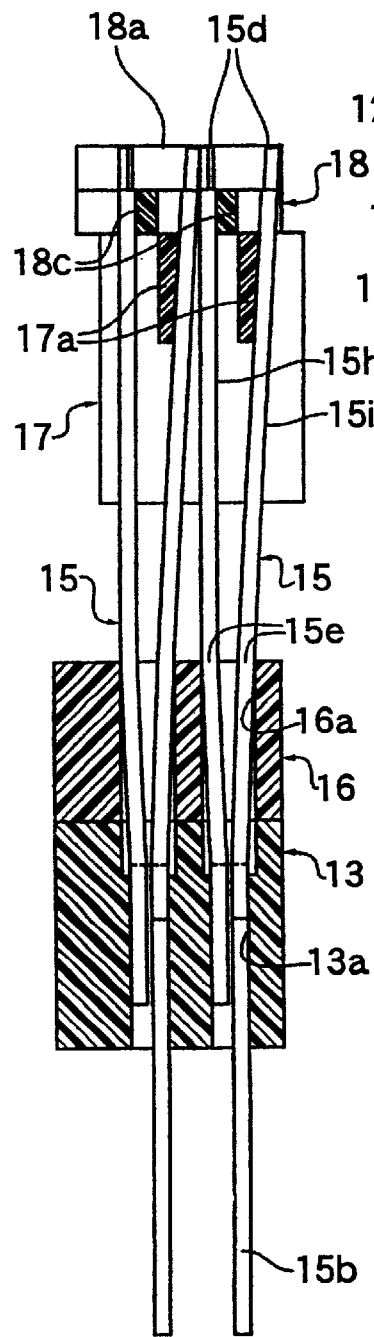
FIG. 7B is a sectional view showing the contact pin with the pair of contact portions being opened according to the first embodiment.
Figure 7C:
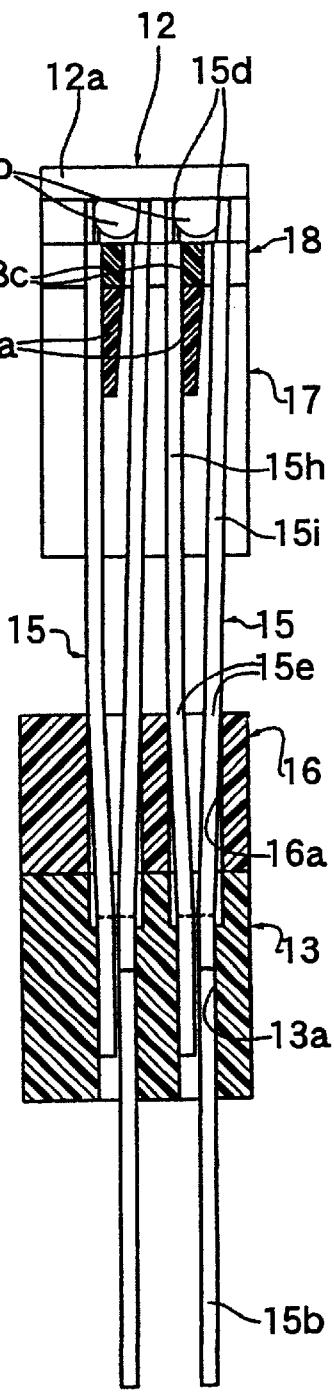
FIG. 7C is a sectional view showing a state that the pair of contact portions of the contact pin clamping a solder ball according to the first embodiment.
Figure 8:
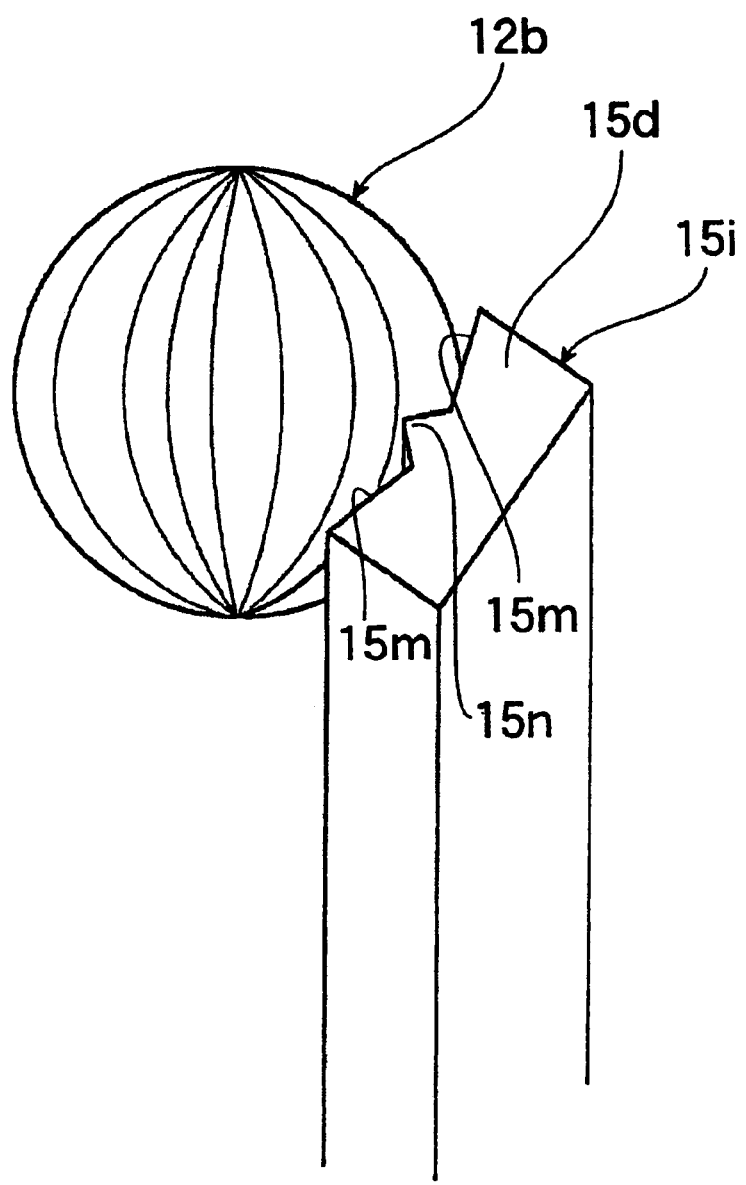
FIG. 8 is a perspective view showing a contact portion of a movable side elastic piece of the contact pin and the solder ball according to the first embodiment.

Moreover, the preload plate 16, as shown in FIGS. 7A–7C, is detachably mounted on the socket body 13 and, through the preload plate 16, preload holes 16a are formed so that each of the paired elastic pieces 15h and 15i is inserted in each of the preload holes 16a. A diameter of the preload hole 16a is set so that, in a state that each of the paired elastic pieces 15h and 15i is inserted in each of the preload holes 16a, the preload hole 16a is adapted to previously press the paired elastic pieces 15h and 15i in a direction as the contact portions 15d of the elastic pieces 15h and 15i are close to each other.

Because the bent portion 15e is formed on each of the paired elastic pieces 15h and 15i, while each of the paired elastic pieces 15h and 15i is inserted in each of the preload holes 16a, the vertex portions of the bent portions 15e are pressed by an inner wall of the preload hole 16a.

On the other hand, the slide plate 17 is arranged to be slidable in a right and left direction (a slide direction in substantially parallel to a mount surface portion 18a of the top plate 18) in FIG. 2, FIGS. 7A–7C. When the slide plate 17 is slid, the movable elastic piece 15i of the contact pin 15 is elastically deformed so as to displace the contact portion 15d in a predetermined length. Incidentally, the predetermined length of the displacement of the contact portion 15d of the movable elastic piece 15i is described hereinafter.

Figure 9:
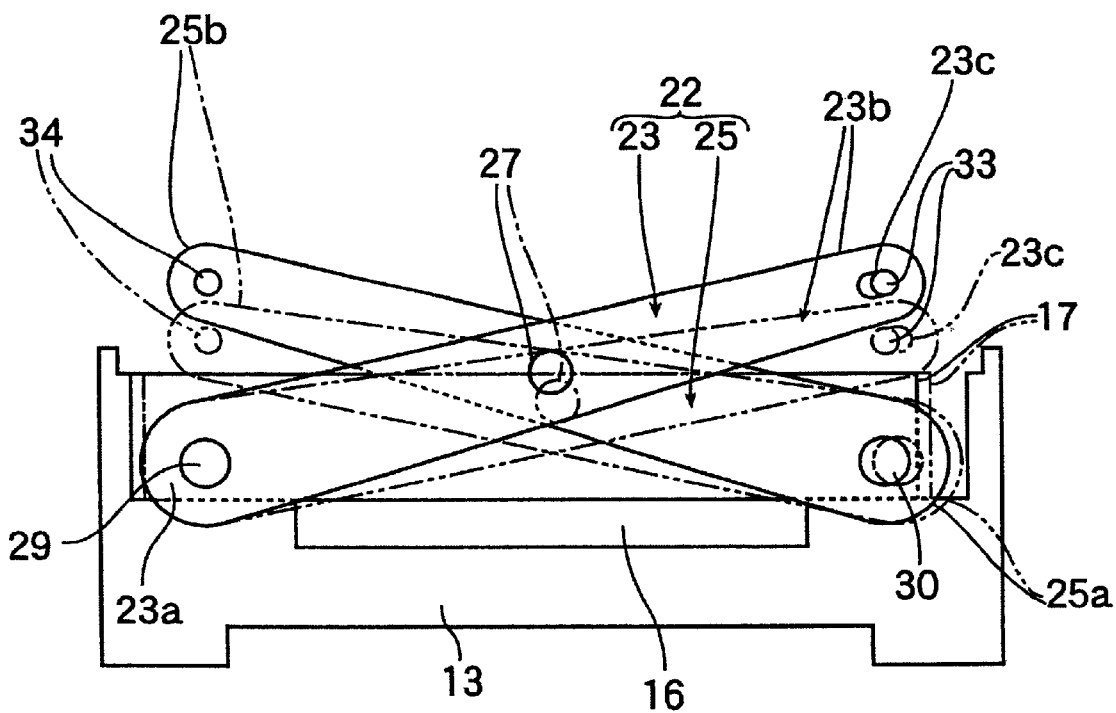
FIG. 9 is an explanation view showing an operation of an X-shaped link according to the first embodiment.

The operation member 19 and the slide plate 17 are mechanically connected through X-shaped links 22 shown in FIGS. 2 and 9 so that, when the operation member 19 is moved vertically, the slide plate 17 is slid in the right and left direction by operations of the X-shaped links 22. The slide plate 17 is provided with a press portion 17a adapted to press the movable elastic piece 15i so as to elastically deform the movable elastic piece 15i.

The X-shaped links 22 are disposed correspondingly to both side surface portions of the square shaped slide plate 17.

To explain it concretely, the X-shaped link 22, as shown in FIGS. 2 and 9, is provided with a first link member 23 and a second link member 25 each having a same length. The first link member 23 and the second link member 25 are rotatably joined by a central joint pin 27.

The first link member 23 has a lower end portion 23a in FIG. 9, that is, one end portion 23a of the socket body side, and the lower end portion 23a is pivotally joined to the socket body 13 by a lower end joint pin 29. The second link member 25 has a lower end portion 25a of the socket body side, and the slide plate 17 has one end portion in the slide direction thereof. The lower end portion 25a of the second link member 25 is rotatably joined to the one end portion of the slide plate 17 by a lower end joint pin 30. Upper end portions 23b and 25b, that is, other end portions opposite to the one end portions 23a and 25a of the first and second link members 23 and 25 are joined to the operation member 19 by upper joint pins 33 and 34, respectively. The first link member 23 is formed at its upper end portion 23b with a slot 23c so that the first link member 23 is joined through the slot 23c to the operation member 17 by the upper joint pin 33.

Figure 10:
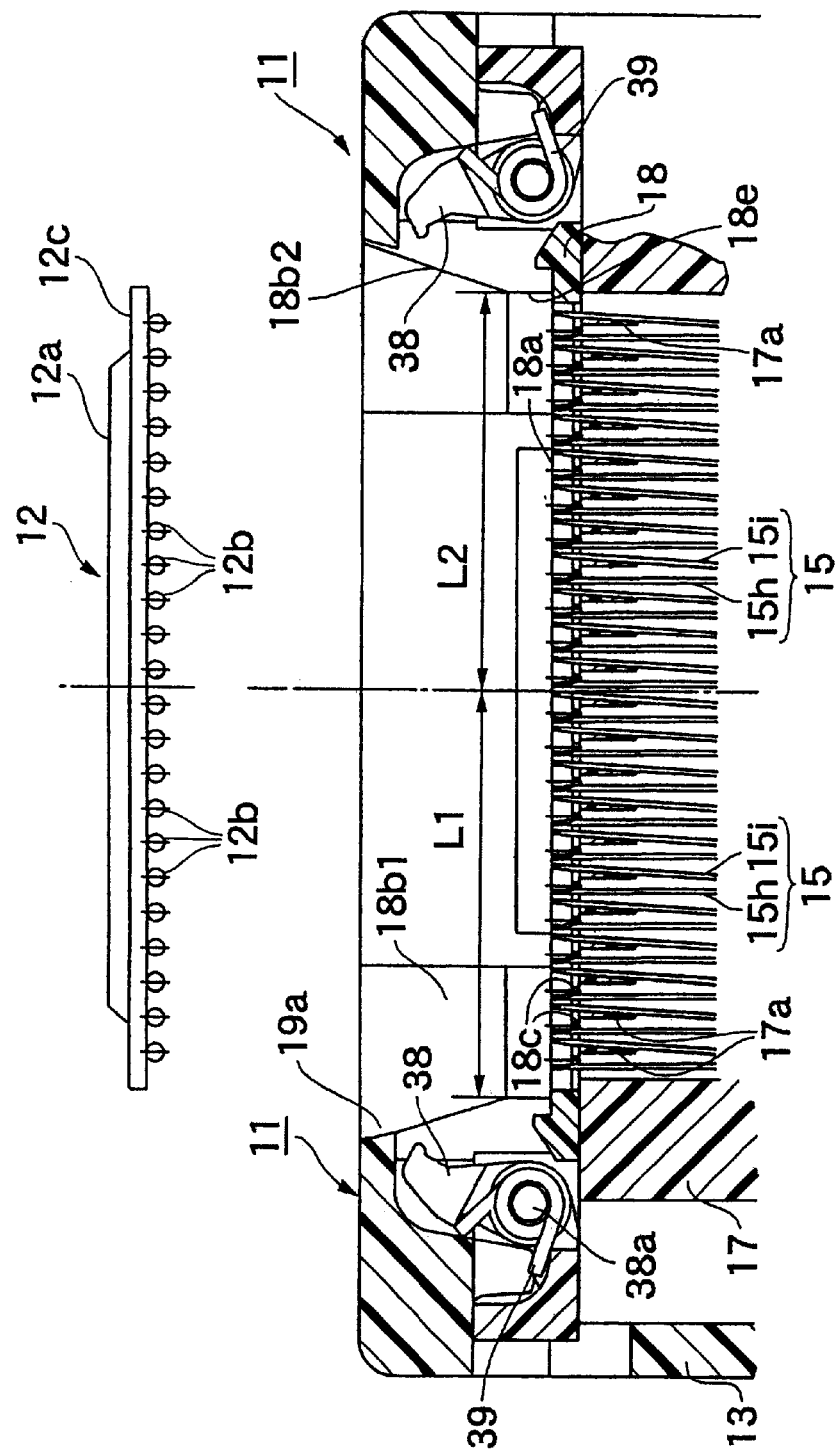
FIG. 10 is a sectional view showing a state that an operational member of the first embodiment is pressed downward.

The top plate 18 is provided with a mount surface portion 18a on which the IC package 12 is mounted. The top plate 18 is also provided with guide portions 18b1 and 18b2 for arranging the IC package 12 to a predetermined position on the mount surface portion 18a. As shown in FIG. 1 and FIG. 10, one pair of guide portions 18b1 are mounted on the mount surface portion 18a in correspondence with one pair of corner portions of the IC package 12, and other pair of guide portions 18b2 are mounted on the mount surface 18a in correspondence with other pair of corner portions of the IC package 12. The one pair of guide portions 18b1 is opposite to the other pair of guide portions 18b2 in the right and left direction (displacement direction of the contact portion 15d).

In FIG. 10, the one pair of guide portions 18b1 is arranged on one side (left side) of the mount surface portion 18a with respect to a center thereof, and the other pair of guide portions 18b2 is arranged on other side (right side) of the mount surface portion 18a with respect to the center thereof.

The one pair of guide portions 18b1 and the other pair of guide portions 18b2 are arranged so that a distance L1 between a middle point of the guide portions 18b1 and the center of the mount surface portion 18a is different from a distance L2 between a middle point of the guide portions 18b2 and the center thereof. Then, in this embodiment, the distance L2 is slightly shorter than the distance L1. Each of the guide portions 18b2 is provided with an inner wall surface on which a stopper portion 18e is formed.

When the contact portion 15d of the movable elastic piece 15i is displaced by the slide of the slide plate 17, the contact portion 15d is stuck to the solder ball 12b so that, when the package body 12a is moved according to the displacement of the contact portion 15d of the movable elastic piece 15i, the package body 12a is contacted to the stopper portions 18e of the guide portions 18b2 so as to be stopped.

A displacement length of the contact portion 15d of the movable elastic piece 15i by the slide plate 17 is set to be longer than that of the package body 12a which is displaced to be contacted up to the stopper portions 18e.

Furthermore, the top plate 18 is formed with positioning portions 18c. Each of the positioning portions 18c is arranged to be inserted between each of the paired contact portions 15d of each of the contact pins 15. The positioning portion 18c has a function for positioning the paired contact portions 15d of each of the contact pins 15.

While the paired elastic pieces 15h and 15i of the contact pin 15 is not subjected to any external force (the contact portions 15d are closed), the positioning portion 18c is clamped with the elastic pieces 15h and 15i so as to be held thereby.

The operation member 19, as shown in FIGS. 1, 2 and so on, is provided with an opening 19a having a predetermined area which allows the IC package 12 to be inserted therein. The IC package 12 is inserted through the opening 19a so as to be mounted on the mount surface 18a, so that the IC package 12 is located at the predetermined position defined by the guide portions 18b1 and 18b2.

Figure 3:
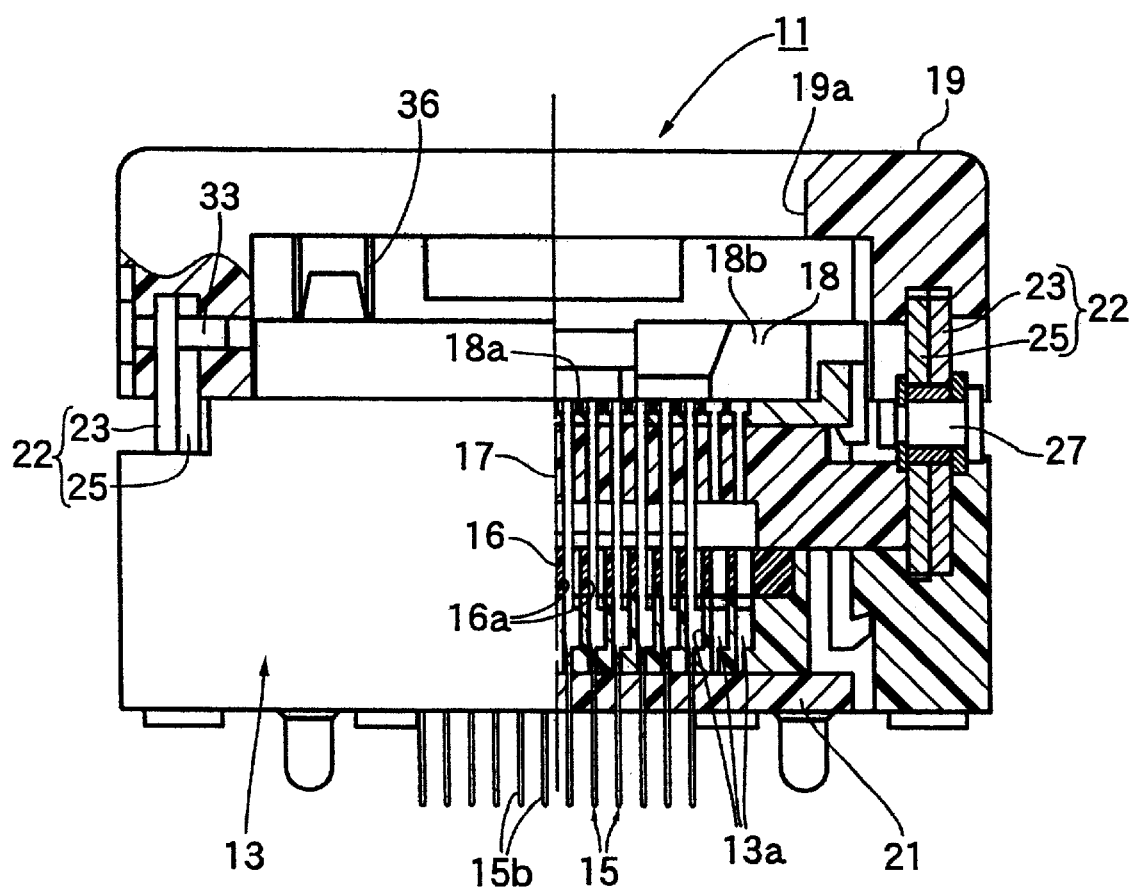
FIG. 3 is a sectional view taken along a line III—III in FIG. 1 according to the first embodiment.

The operation member 19, as shown in FIG. 3, is arranged to be movable vertically with respect to the socket body 13 and is urged upward by springs 36. The operation member 19 is also formed with a pair of operative convex portions 19b for rotating a pair of latch members 38.

As shown in FIG. 10 and so on, each of the latch members 38 is disposed through a shaft 38a to the socket body 13 so as to be rotatable about the shaft 38a. The latch members 38 are urged by springs 39 toward the center of the socket body 13, respectively.

Each of the latch members 38 is provided with a holding portion 38b for holding a peripheral portion 12c of the IC package 12 mounted at the predetermined position on the mount surface 18a. Each of the latch members 38 is also formed with a press portion 38c permitted to be pressed by the convex portion 19b of the operation member 19.

When the operation member 19 is moved downward against the urging force of the springs 36, the press portion 38c of each of the latch members 38 is pressed by the convex portion 19b so that the latch members 38 are rotated outward from the socket body 13 against the urging force of the springs 39, whereby the holding portion 38b of each of the latch members 38 is withdrawn from a mount position of the IC package 12 on the mount surface portion 18a to a predetermined withdrawal position at which the mount of the IC package 12 to the top plate 19 is not interfered.

Next, an operation of the IC socket 11 of the first embodiment will be described hereunder hereinafter.

Each of the contact pins 15 carries out substantially the same movement, and accordingly, only the movement of only one of the contact pins 15 will be explained.

When each of the IC packages 12 is set to each of the IC sockets 11 arranged on the printed circuit board, the operation member 19 of each IC socket 11 is pressed downward. The downward movement of the operation member 19 makes the slide plate 17 slide in the right direction, which is shown as a chain double-dashed line in FIG. 9. By the press portion 17a of the slide plate 17 sliding in the right direction, the movable elastic piece 15i is pressed to be elastically deformed. The stationary elastic piece 15h is kept at a predetermined position by the positioning portion 18c of the top plate 18.

The deformation of the movable elastic piece 15i due to the elastic deformation makes open the paired contact portions 15d of the elastic pieces 15h and 15i as shown in FIG. 7B.

Simultaneously with the opening of the contact portions 15d of the contact pin 15, the press portion 38c of each of the latch members 38 is pressed by the convex portion 19b of the operation member 19 so that each of the latch members 38 rotates outward from the socket body 13 towards the withdrawal position against the urging force of the spring 39, thereby displacing the holding portion 38b of each of the latch members 38 to the withdrawal position, as shown in FIG. 10.

In this state, the IC package 12 is mounted on the mount surface 18a of the top plate 18 so as to be guided by the guide portions 18b1 and 18b2, thereby being set to the predetermined position on the mount surface portion 18a. Each of the solder balls 12b is inserted in each of the paired and opened contact portions 15d of each of the contact pins 15 while each of the solder balls 12b is in a non-contact state with each of the paired contact portions 15d.

After the insertion of each solder ball 12b in each paired contact portion 15d, when the downward press force applied to the operation member 19 is released, the operation member 19 is moved upward by the urging force of the springs 36, so that the slide plate 17 is slid towards the left direction in FIG. 7A to FIG. 7C by the X-shaped operation link 22, and that each of the latch members 38 is rotated towards the mounted IC package 12 by the urging force of the spring 39.

When the slide plate 17 is slid in the left direction in FIG. 7A to FIG. 7C, the press force applied to the movable elastic piece 15i of the contact pin 15 is released so that the movable elastic piece 15i is getting to return to the original position so that the solder ball 12b is clamped by the contact portions 15d of the movable elastic piece 15i and the stationary elastic piece 15h (as referred to FIG. 7C). When the solder ball 12b is clamped by the contact portions 15d of the movable elastic piece 15i and the stationary elastic piece 15h, the stationary elastic piece 15h is slightly elastically deformed so that the contact portion 15d of the stationary elastic piece 15h is slightly displaced so as to widen the interval between the contact portions 15d of the movable elastic piece 15i and the stationary elastic piece 15h. As a result, each of the solder balls 12b of the IC package 12 and the printed circuit board on which the IC socket 11 is mounted are electrically connected through each of the contact pins 15 of the IC socket 11. When the solder ball 12b is electrically connected to the contact pin 15, the inclined surface 15j of the stationary elastic piece 15h is slid on the solder ball 12b to obtain a wiping effect.

In a state that the IC package 12 is held on the IC socket 11, the printed circuit board on which the IC socket 11 is mounted is set in a burn-in tank. Through the increasing of a temperature in the burn-in tank, the burn-in test of the IC package 12 is carried out. When the temperature in the burn-in tank is increased, the solder ball 12 is softened so that the projection portion 15n of the contact portion 15d of the movable elastic piece 15i bites into the side surface portion of the solder ball 12b, as shown in FIGS. 11A and 11B.

Next, in a case of removing the IC package 12 from the IC socket 11, similarly to the mounting operation, by pressing the operation member 19 downward, the slide plate 17 is slid in the right direction from a state of the slide plate 17 shown in FIGS. 11A and 11B so that, as shown in FIGS. 12A and 12B and FIGS. 13A and 13B, the movable elastic piece 15i is elastically deformed in the right direction, thereby making the contact portion 15d of the movable elastic piece 15i displace in the right direction in FIGS. 12A–12B and FIGS. 13A–13B. As shown in FIG. 13B, because the projection portion 15n of the contact portion 15d of the movable elastic piece 15i bites into the solder ball 12, the solder ball 12 is stuck to the contact portion 15d of the movable elastic piece 15i. In accordance with the displacement of the contact portion 15d of the movable elastic piece 15i, the IC package 12 is slid in the right direction in FIG. 13B so that the solder ball 12b is separated from the contact portion 15d of the stationary elastic piece 15h. Then, as shown in FIG. 13A, an end surface of the peripheral portion 12c of the package body 12a is contacted to the stopper portions 18e of the guide portions 18b2 so that the package body 12 is stopped by the guide portions 18b2. Because the displacement length of the contact portion 15d of the movable elastic piece 15i is set so that the contact portion 15d of the movable elastic piece 15i is further displaced from the state that the package body 12a is contacted to the stopper portions 18e, when the movable elastic piece 15i is further elastically deformed from the contacting state thereof to the stopper portions 18e so as to make displace the contact portion 15d of the movable elastic piece 15i in the right direction in FIGS. 14A and 14B, the projection portion 15n of the contact portion 15d is separated from the solder ball 12b, making it possible to surely prevent the solder ball 12b from being stuck to the contact portion 15d. As a result, the paired contact portions 15d of the contact pin 15 are separated from the solder ball 12 to make it possible to remove the IC package 12 from the IC socket 11 by the automatic machine without using extracting force.

[Second Embodiment]

FIGS. 15A and 15B represent the second embodiment of the present invention. In this embodiment, the contact portion 15d of the movable elastic piece 15i has a slender rod-shape and a rectangular shape in its lateral cross section so that the contact portion 15d is adapted to bite into the softened solder ball 12b. Further, the stationary elastic piece 15i is omitted from FIGS. 15A and 15B. In this second embodiment, it is easy for the solder ball 12b to be stuck to the contact portion 15d of the movable elastic piece 15i, making it possible to prevent the solder ball 12b from being stuck to the contact portion 15d of the stationary elastic piece 15h.

Other structures and operations of this second embodiment are substantially similar to those of the first embodiment. Inn the first and second embodiments, the present invention is applied to the IC socket as "socket for electrical parts", but the present invention is not limited to this application, and the present invention may be applied to a socket for an electrical part except for the IC package. Moreover, in the first and second embodiments, the movable plate is adapted to move in a horizontal direction (in substantially parallel to the mount surface portion), but the present invention is not limited to this structure, and in one modification, the movable plate may be adapted to move in a vertical direction so as to make both of the paired contact portions displace (open and close).

In the type of IC socket having the structure capable of making both of the paired contact portions open and close, in order to permit the solder ball to be stuck to either contact portion of the contact pin, each pair of the guide portions arranged in the slide direction is provided with the stopper portion 18e. Respective displacement lengths of the contact portions of the movable elastic piece and the stationary elastic piece by the slide plate are set to be longer than the displacement length of the package body which is displaced to the stopper portions.

As a result, in this modification, in a case where the projection portion 15n into which the solder ball 12b bites is not formed on the contact portion 15d according to the first embodiment, it is possible to prevent the solder ball from being stuck into the contact portions. Furthermore, in the above embodiments, the stationary elastic piece and the movable elastic piece are formed on the contact pin, but the present invention is applicable to the structure in which the movable elastic piece is formed only on the contact pin. In addition, in the above embodiments, the stopper portion is formed to the guide portion of the socket body, but the present invention is not limited to this structure, and the stopper portion may be provided to other portion of the socket body to which the IC package is permitted to be contacted.

While there has been described what is at present considered to be the preferred embodiments and modifications of the present invention. It will be understood that various modifications which are not described yet may be made therein, and it is intended to cover in the appended claims all such modifications as fall within the true spirit and scope of the invention.

What is claimed is:

1. A socket for an electrical part, comprising:
   a socket body having a mount portion to mount an electrical part thereon, the electrical part having a solder ball;
   a movable plate disposed on and moveable with respect to the socket body;
   a contact pin arranged on the socket body to be contacted with or separated from the solder ball of the electrical part, the contact pin having a front end portion with a pair of elastic pieces formed at the front end portion, the elastic pieces each having a contact portion thereon,
      one of the elastic pieces being a movable elastic piece to be elastically deformable in response to movement of the moveable plate such that the contact portion thereof is moveable by a displacement length,
      one of the contact portions having a holding contact portion so that it is easier for the solder ball to stick to the holding contact portion than to the other contact portion; and
   a stopper formed on one side of the socket body to contact the electrical part when the solder ball is stuck to the holding device, the electrical part being movable with deformation of the movable elastic piece such that the electrical part stops at the stopper and is moveable by a length less than the displacement length.

2. A socket for an electrical part according to claim 1, wherein
   the electrical part is mounted on a mount surface,
   said movable plate is adapted to be movable in a direction substantially parallel to the mount surface, and
   one of said elastic pieces is a stationary side elastic piece.

3. A socket for an electrical part, comprising:
   a socket body having a mount portion to mount an electrical part thereon, the electrical part having a solder ball;
   a movable plate disposed on and moveable with respect to the socket body;
   a contact pin arranged on the socket body to be contacted with or separated from the solder ball of the electrical part, the contact pin having a front end portion with a pair of elastic pieces formed at the front end portion, the elastic pieces each having a contact portion thereon,
      one of the elastic pieces being a movable elastic piece to be elastically deformable in response to movement of the moveable plate such that the contact portion thereof is moveable by a displacement length,
      one of the contact portions being a holding contact portion and having a projection adapted to bite into a side surface of the solder ball so that it is easy for the solder ball to be stuck to the holding contact portion; and
   a stopper to contact the electrical part when the solder ball is stuck to the holding contact portion, the electrical part being movable with deformation of the movable elastic piece such that the electrical part stops at the stopper and is moveable by a length less than the displacement length.

4. A socket for an electrical part, comprising:
   a socket body having a mount portion to mount an electrical part thereon, the electrical part having a solder ball;
   a movable plate disposed on and moveable with respect to the socket body;
   a contact pin arranged on the socket body to be contacted with or separated from the solder ball of the electrical part, the contact pin having a front end portion with a pair of elastic pieces formed at the front end portion, the elastic pieces each having a contact portion thereon,
      one of the elastic pieces being a movable elastic piece to be elastically deformable in response to movement of the moveable plate such that the contact portion thereof is moveable by a displacement length, one of the contact portions being a holding contact portion and having a substantially rod shape adapted to bite into a side surface of the solder ball so that it is easy for the solder ball to be stuck to the holding contact portion; and a stopper to contact the electrical part when the solder ball is stuck to the holding contact portion, the electrical part being movable with deformation of the movable elastic piece such that the electrical part stops at the stopper and is moveable by a length less than the displacement length.

5. A socket for an electrical part, comprising:

a socket body having a mount portion to mount an electrical part thereon, the electrical part having a solder ball;

a movable plate disposed on and moveable with respect to the socket body;

a contact pin arranged on the socket body to be contacted with or separated from the solder ball of the electrical part, the contact pin having a front end portion with a pair of elastic pieces formed at the front end, the elastic pieces each having a contact portion thereon, one of the elastic pieces being a movable elastic piece to be elastically deformable in response to movement of the moveable plate such that the contact portion thereof is moveable by a displacement length to separate the contact portion from a side surface of the solder ball, one of the contact portions having a press portion to press the solder ball; and a stopper formed on one side of the socket body to contact the electrical part when the solder ball is pressed to fit to the press portion, the electrical part being movable with deformation of the movable elastic piece such that the electrical part stops at the stopper and is moveable by a length less than the displacement length.

* * * * *